(12) United States Patent
Tuen et al.

(10) Patent No.: US 8,305,771 B2
(45) Date of Patent: Nov. 6, 2012

(54) ELECTROMAGNETIC INTERFERENCE SUPPRESSING DEVICE AND RELATED ELECTRONIC DEVICE

(75) Inventors: Lung-Fai Tuen, Taipei Hsien (TW);
Chiu-Hsien Chang, Taipei Hsien (TW);
Hong-Kuei Lee, Taipei Hsien (TW);
Chi-Fang Weng, Taipei Hsien (TW);
Chen-Yu Li, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 244 days.

(21) Appl. No.: 12/712,202

(22) Filed: Feb. 25, 2010

(65) Prior Publication Data

US 2010/0246154 A1 Sep. 30, 2010

(30) Foreign Application Priority Data

Mar. 26, 2009 (TW) .............................. 98109903 A

(51) Int. Cl.
*H05K 9/00* (2006.01)
(52) U.S. Cl. .......................... 361/816; 361/799; 361/818
(58) Field of Classification Search .......... 361/799–800, 361/816, 818, 600, 728; 174/5, 35 R, 51, 174/350, 377
See application file for complete search history.

(56) References Cited

U.S. PATENT DOCUMENTS

| 5,167,531 | A | * | 12/1992 | Broschard et al. | ......... | 439/541.5 |
|---|---|---|---|---|---|---|
| 5,281,169 | A | * | 1/1994 | Kiat et al. | ................ | 439/607.35 |
| 5,288,247 | A | * | 2/1994 | Kaufman | ................. | 439/607.33 |
| 5,758,413 | A | * | 6/1998 | Chong et al. | .................... | 29/852 |
| 5,947,769 | A | * | 9/1999 | Leonard et al. | .......... | 439/607.53 |
| 5,967,846 | A | * | 10/1999 | Davis et al. | ............. | 439/607.19 |
| 6,211,457 | B1 | * | 4/2001 | Cama et al. | .................... | 174/380 |
| 6,322,392 | B1 | * | 11/2001 | Wang | ....................... | 439/607.14 |
| 6,933,806 | B2 | * | 8/2005 | Maguire et al. | ............... | 333/185 |
| 7,909,648 | B2 | * | 3/2011 | Tai | ............................ | 439/607.32 |
| 2007/0059964 | A1 | * | 3/2007 | Choy et al. | .................... | 439/328 |

FOREIGN PATENT DOCUMENTS

TW 517936 1/2003

OTHER PUBLICATIONS

Office action mailed on Jun. 2, 2011 for the China application No. 200910131191.4, p. 3 line 5-14 and line 16-17 and line 20-26 and line 29-34 and line 37-43, p. 4 line 1-6 and line 9-14 and line 17-22 and line 25-27 and line 29-30 and line 33-35 and line 38-45, p. 5 line 1-2 and line 4-5.
Office action mailed on Feb. 21, 2012 for the Taiwan application No. 098109903, p. 1 line 14, p. 2 line 1-16 and line 21-24, p. 3 line 2-4 and line 9-11 and line 16-19 and line 23-26, p. 4 line 5-6.

* cited by examiner

*Primary Examiner* — Hung S Bui
(74) *Attorney, Agent, or Firm* — Winston Hsu; Scott Margo

(57) ABSTRACT

An electromagnetic interference suppressing device includes a plurality of signal guiding units coupled to a metal housing of an electronic component for receiving a plurality of signals transmitted from the metal housing (the electronic component is installed on a circuit board), a plurality of grounding units coupled to a plurality of ground pads of the circuit board for transmitting the plurality of signals to the plurality of ground pads, and a main body coupled to the plurality of signal guiding units and the plurality of grounding units for transmitting the plurality of signals between the plurality of signal guiding units and the plurality of grounding units so as to implement a return path.

22 Claims, 9 Drawing Sheets

ELECTROMAGNETIC INTERFERENCE SUPPRESSING DEVICE AND RELATED ELECTRONIC DEVICE

BACKGROUND OF THE INVENTION

1. Field of the Invention

The present invention relates to an electromagnetic interference suppressing device and related electronic device, and more particularly, to an electromagnetic interference suppressing device capable of effectively suppressing electromagnetic interference by enhancing completeness of a return path among electronic components and related electronic device.

2. Description of the Prior Art

With the rapid progression of technology, various high speed signal transmission interfaces, such as Digital Visual Interface (DVI) and High Definition Multimedia Interface (HDMI), etc. are being developed to meet the demand for higher resolution video display. However, electromagnetic interference at high frequencies and high energy occur when a large number of signals are transmitted through the high speed signal transmission interface. Consequently, a proper scheme for improving electromagnetic compatibility (EMC) and electromagnetic interference (EMI) of the transmission interfaces is desirable.

In general, electromagnetic interference may occur in many situations during signal transmission. For example, impedance mismatch between transmission lines and electronic components, or discontinuities occurring within bodies of electronic components can cause noise energy radiation. Usually, electromagnetic interference is generated in connections between circuit boards, connectors, integrated circuits, and even between different layers of a circuit board. A conventional method for suppressing electromagnetic interference uses an electromagnetic interference shielding material, such as a spring or a gasket, to reduce transfer of the noise energy. However, these conventional methods of preventing electromagnetic interference take up space and are expensive, without providing a laudable suppression effect.

Please refer to FIG. 1. FIG. 1 is a schematic diagram of a motherboard 10 in the prior art. The motherboard 10 employs a multilayer printed circuit board design. The motherboard 10 has a signal connector 104 installed on the motherboard 10 for transmitting or receiving signals to/from an external device through connection with an external connector 102. As shown in FIG. 1, the signal connector 104 includes an insulation body 106, a conducting terminal 108, and a metal housing 110. The insulation body 106 is coupled to the conducting terminal 108. The conducting terminal 108 is utilized for transmitting signals. The metal housing 110 is utilized for implementing a return path of signal through bosses A, B (not shown in FIG. 1) on the motherboard 10.

In the prior art, the conventional method for suppressing electromagnetic interference usually uses a spring or a gasket on the metal housing 110 to prevent electromagnetic interference. However, completeness of the return path between the motherboard 10 and the signal connector 104 is often overlooked. The signal connector 104 is bound to the grounding layer of the upper layer of the motherboard 10 by only the small-area bosses A, B, and the grounding layer of the upper layer of the motherboard 10 connects with the lowermost layer of the motherboard 10 via an internal path. However, the connection approach has various non-ideal factors, such as difference of impedance characteristics among different layers, different layout locations and different layout areas of the grounding layer, and different thicknesses of different layers, which result in discontinuities along the return path. Therefore, the signal transmission path may not be an optimum (shortest) path, but instead corresponds to the transmission environment, increasing voltage offset, as well as incurring extra electromagnetic interference caused by the lengthened return path. Further, the longer return path results in a transmission line effect. In other words, along the signal transmission path, existing impedance variations may cause signal reflection due to impedance mismatch, so that the incident wave and the reflected wave will exhibit a standing wave effect. When the standing wave ratio is large, both radiated and conducted electromagnetic interference may occur, reducing signal integrity. Thus, a solution is needed for enhancing completeness of the return path for the multilayer motherboard 10 to reduce electromagnetic interference.

SUMMARY OF THE INVENTION

It is therefore a primary objective of the claimed invention to provide an electromagnetic interference suppressing device and related electronic device.

The present invention discloses an electromagnetic interference suppressing device, comprising a plurality of signal guiding units coupled to a metal housing of an electronic component for receiving a plurality of signals transmitted from the metal housing, wherein the electronic component is installed on a circuit board; a plurality of grounding units coupled to a plurality of ground pads of the circuit board for transmitting the plurality of signals to the plurality of ground pads; and a main body coupled to the plurality of signal guiding units and the plurality of grounding units for transmitting the plurality of signals between the plurality of signal guiding units and the plurality of grounding units so as to implement a return path.

The present invention further discloses an electronic device, comprising a circuit board for installing an electronic component; and an electromagnetic interference suppressing device, wherein the electromagnetic interference suppressing device comprising a plurality of signal guiding units coupled to a metal housing of the electronic component for receiving a plurality of signals transmitted from the metal housing; a plurality of grounding units coupled to a plurality of ground pads of the circuit board for transmitting the plurality of signals to the plurality of ground pads; and a main body coupled to the plurality of signal guiding units and the plurality of grounding units for transmitting the plurality of signals between the plurality of signal guiding units and the plurality of grounding units so as to implement a return path.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
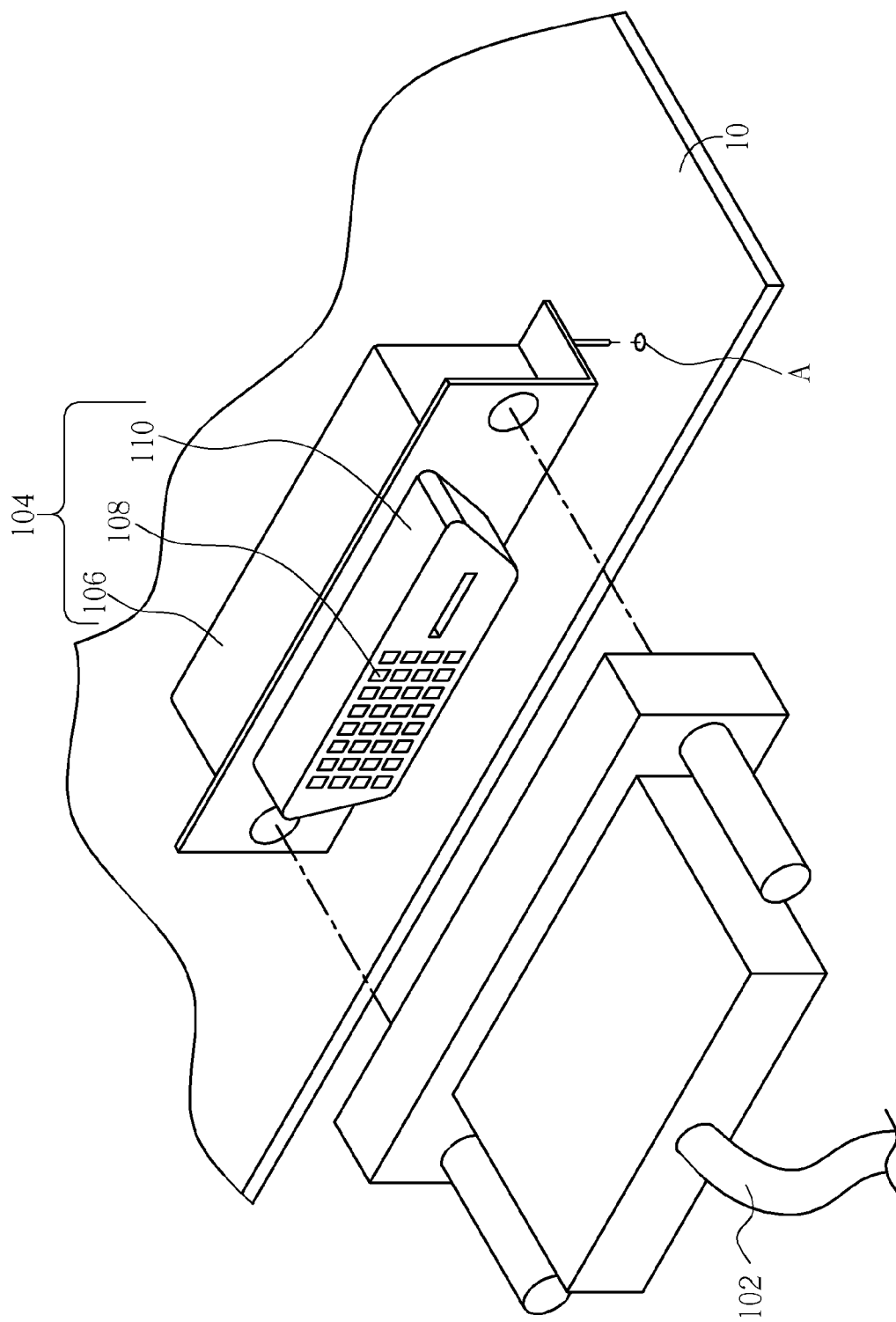
FIG. 1 is a schematic diagram of a motherboard in the prior art.
Figure 2:
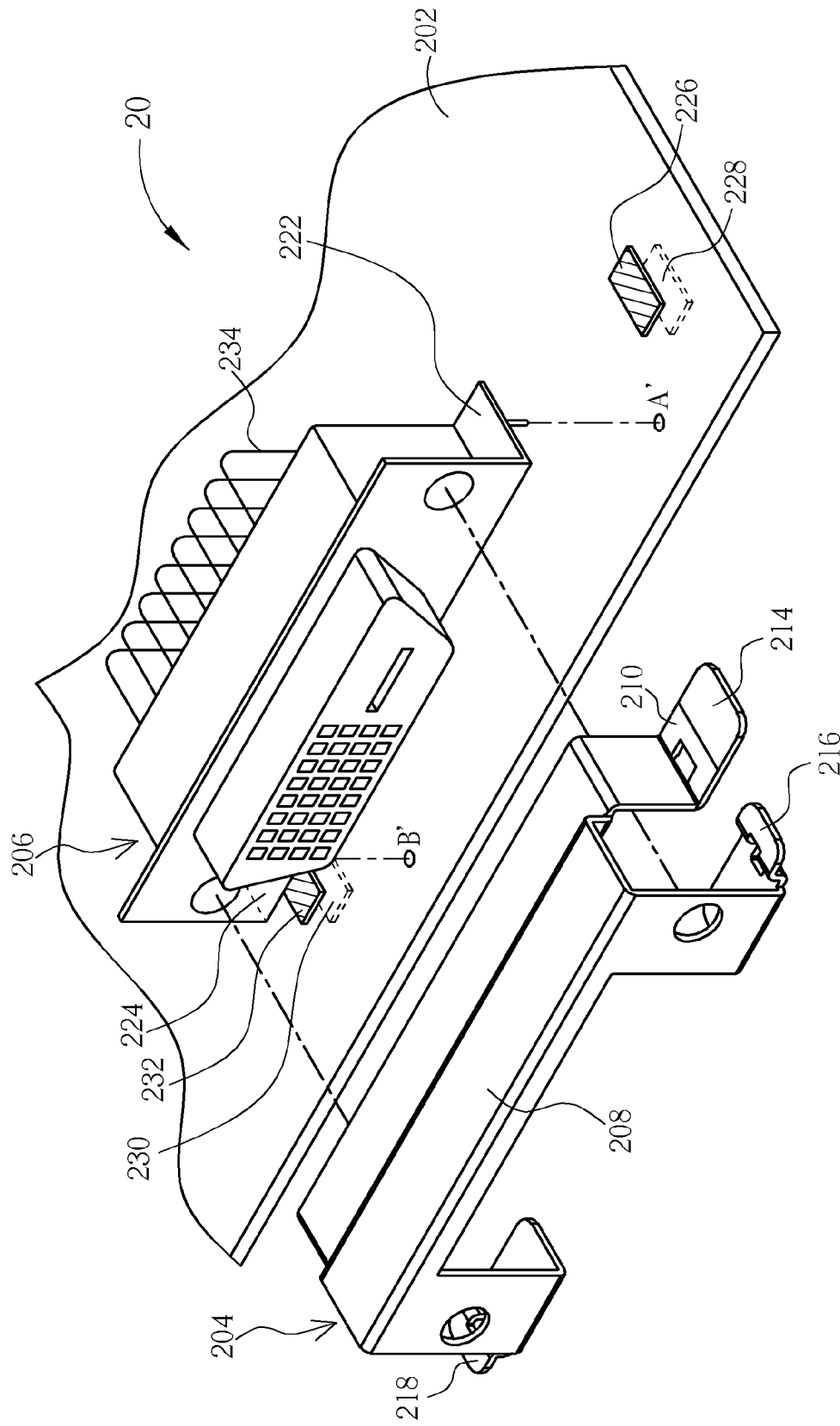
FIG. 2 is a schematic diagram of an electronic device capable of suppressing electromagnetic interference according to an embodiment of the invention.
Figure 3:
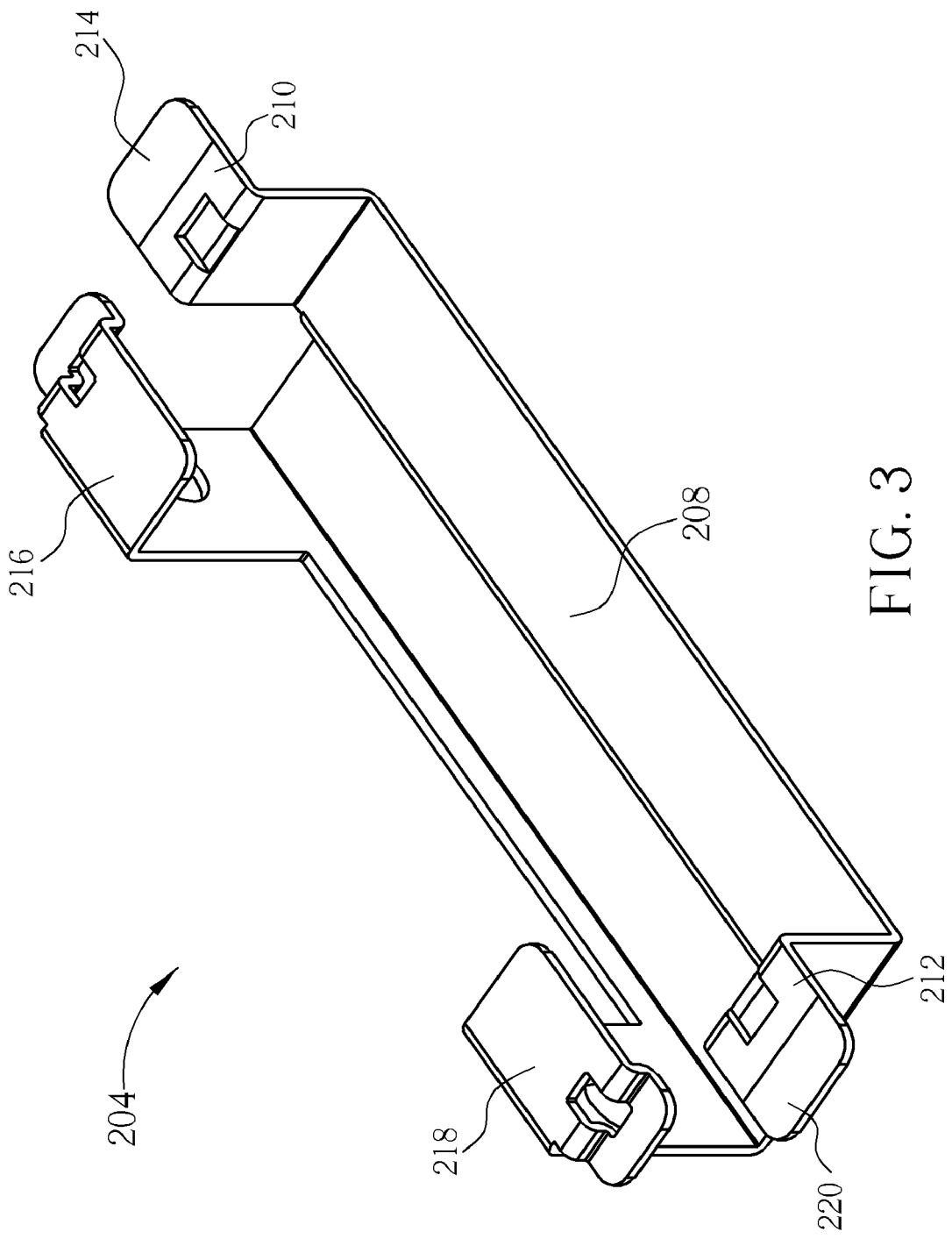
FIG. 3 is a three dimensional view of an electromagnetic interference suppressing device according to an embodiment of the invention.

Please refer to FIG. 2 and FIG. 3. FIG. 2 is a schematic diagram of an electronic device 20 capable of suppressing electromagnetic interference according to an embodiment of the invention. FIG. 3 is a three-dimensional view of an electromagnetic interference suppressing device 204 according to an embodiment of the invention. The electronic device 20 can be a notebook, a personal digital assistant (PDA), a mobile phone, a smart phone, or a laptop computer, but this is not a limitation of the present invention. The electronic device 20 includes a circuit board 202 and an electromagnetic interference suppressing device 204. The circuit board 202 is preferably a multilayer printed circuit board or motherboard, which can provide mechanical support and electrical connection for each electronic component, but this is not a limitation of the present invention. As shown in FIG. 2, an electronic component 206 is disposed on the circuit board 202. The electronic component 206 can be a high speed signal connector or any other electronic component. Moreover, the electromagnetic interference suppressing device 204 is utilized for improving completeness of a return path for the electronic component 206, which can be used in any connecting place of various input/output signal lines. The electromagnetic interference suppressing device 204 includes a main body 208, signal guiding units 210, 212, and grounding units 214, 216, 218, 220. The signal guiding units 210, 212 are coupled to a metal housing of the electronic component 206 for receiving signals $S_1$, $S_2$ transmitted from the metal housing, respectively. In the embodiment, the signal guiding units 210, 212 are coupled to bonding portions 222, 224 of the electronic component 206, respectively. Further, the signals $S_1$, $S_2$ can be transmitted between the electronic component 206 and the circuit board 202 via bonding points A', B'. The grounding units 214, 216, 218, 220 are coupled to ground pads 226, 228, 230, 232 of the circuit board 202 for transmitting signals $S_1$, $S_2$ to the ground pads 226, 228, 230, 232, respectively. The main body 208 is coupled to the signal guiding units 210, 212 and the grounding units 214, 216, 218, 220 for providing signals $S_1$, $S_2$ transmitted between the signal guiding units 210, 212 and the grounding units 214, 216, 218, 220, so as to implement a return path. In other words, the electronic device 20 can receive signals $S_1$, $S_2$ via the signal guiding units 210, 212, and transmit signals $S_1$, $S_2$ to the ground pads 226, 228, 230, 232 through the grounding units 214, 216, 218, 220, so as to realize shortest return path transmission of signal and prevent electromagnetic interference effectively.

Please further refer to FIG. 3. The main body 208 can be formed along the external perimeter of the electronic component 206 for providing signal transmission paths between the signal guiding units 210, 212 and the ground pads 226, 228, 230, 232 and may also be regarded as a larger, more comprehensive ground area. Please note that, in the embodiment, it takes two signal guiding units and four ground pads, for example, but this is not limited, and the number is dependent on overall system design. For example, as shown in FIG. 3, the amount and location of the grounding units 214, 216, 218, 220 are arranged in a symmetrical manner in order to match the amount and location of the ground pads 226, 228, 230, 232, which are reserved on the circuit board 202. In practice, any amount and location of grounding units having a corresponding amount and location of ground pads is suitable. In addition, any kind of spatial structure, any external appearance of shape, or any thickness of each component of the electromagnetic interference suppressing device 204, which is made of metal, composite materials, or any electrically conductive material, is suitable. For example, each component of the electromagnetic interference suppressing device 204 can be a thin metal slice, a plated or sputtered metallic compound substance, or other electrical conductive substance. Preferably, the main body 208, the signal guiding units 210, 212, and the grounding units 214, 216, 218, 220 can be made of metal materials and formed as a monolithic structure.

Figure 4A:
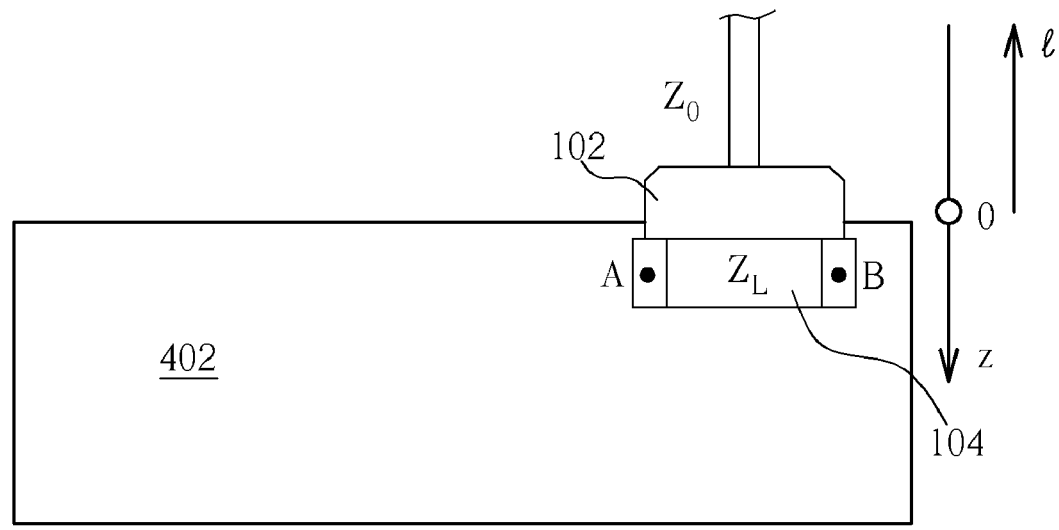
FIG. 4A is a schematic top-view of a motherboard in the prior art.
Figure 4B:
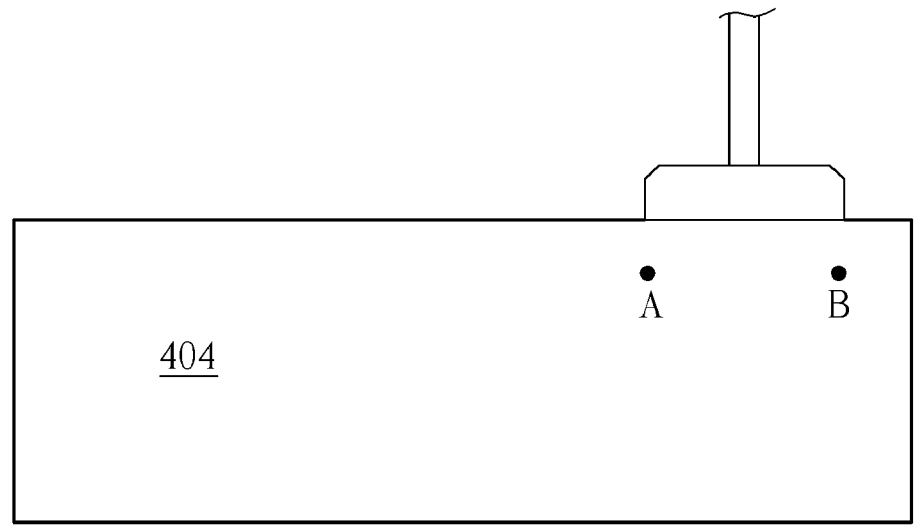
FIG. 4B is schematic bottom-view of a motherboard in the prior art.
Figure 5A:
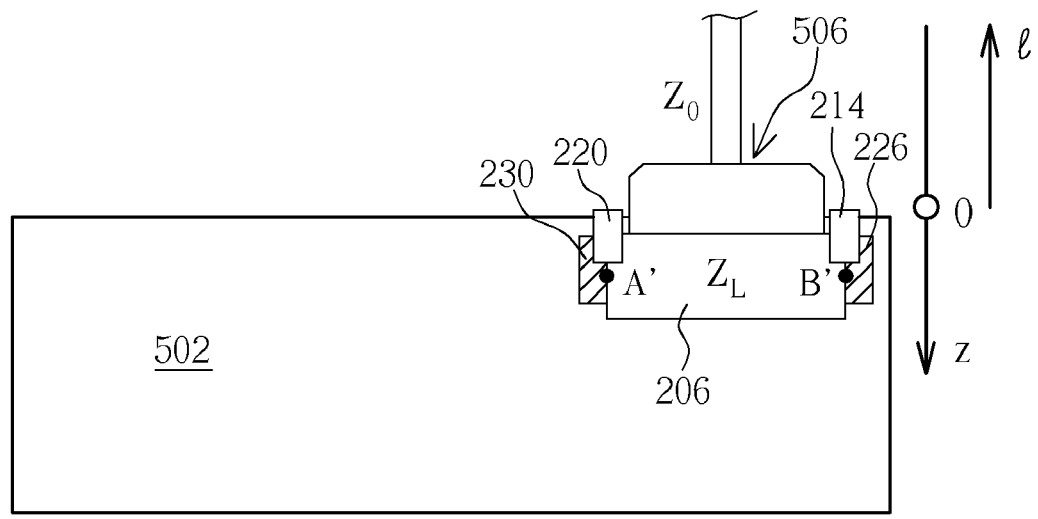
FIG. 5A is a schematic top-view of a circuit board according to an embodiment of the invention
Figure 5B:
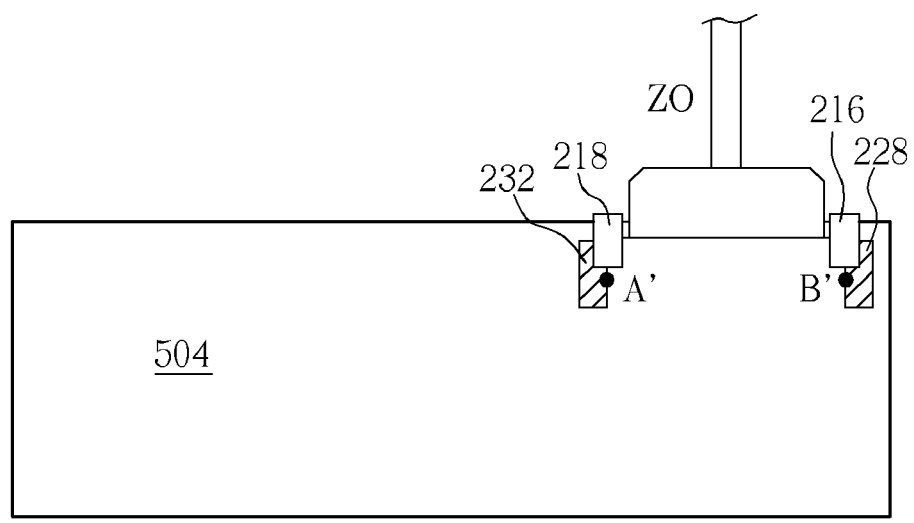
FIG. 5B is schematic bottom-view of a circuit board according to an embodiment of the invention.

Furthermore, regarding the transmission line effect, please refer to FIG. 4A through 5B. FIG. 4A is a schematic top-view of a motherboard 10 in the prior art and FIG. 4B is schematic bottom-view of a motherboard 10 in the prior art. FIG. 5A is a schematic top-view of a circuit board 202 according to an embodiment of the invention and FIG. 5B is a schematic bottom-view of a circuit board 202 according to an embodiment of the invention. As shown in FIG. 4A and FIG. 4B, the uppermost layer and the lowermost layer of motherboard 10 are the top circuit board 402 and bottom circuit board 404, respectively. As shown in FIG. 5A and FIG. 5B, the uppermost layer and the lowermost layer of the circuit board 202 are the top circuit board 502 and bottom circuit board 504, respectively. Generally speaking, whenever there is an impedance mismatch between a transmission line and a load, wave reflection will occur, so that the incident wave and the reflected wave produce a standing wave effect. The amplitude of the voltage wave $V(Z_0)$ may not be a constant value. In other words, the amplitude of the voltage wave $V(Z_0)$ looking along the transmission line is oscillatory with position. The voltage wave $V(Z_0)$ can be expressed as follows:

$$V(Z_0)=|V_0^+|\|1+\Gamma e^{2j\beta Z_0}|=|V_0^+|\|1+\Gamma e^{-2j\beta l}|=|V_0^+|\|1+|\Gamma|e^{j(\theta-2\beta l)}| \quad (1)$$

where $l=-z_0$ represents a displacement from the load ($z_0=0$), $V_0^+$ is incident voltage, $\Gamma$ represents voltage reflection coefficient (where $\Gamma=|\Gamma|e^{j\theta}$), $\theta$ is phase angle of reflection coefficient, and $\beta$ is phase constant.

Therefore, the voltage wave $V(Z_0)$ has an amplitude maximum $V_{max}$ (where $V_{max}=|V_0^+|(1+|\Gamma|)$ at a position ($e^{j(\theta-2\beta l)}=1$), and the voltage wave $V(Z_0)$ has an amplitude minimum $V_{min}$ (where $V_{min}=|V_0^+|(1-|\Gamma|)$ at a position ($e^{j(\theta-2\beta l)}=1$). When the voltage reflection coefficient $\Gamma$ increases, the ratio of the amplitude maximum and the amplitude minimum of the voltage wave $V(Z_0)$ also increases. Therefore, a standing wave ratio (SWR) can be utilized for measuring how load impedance is matched. The SWR can be expressed as follows:

$$SWR = \frac{V_{max}}{V_{min}} = \frac{1+|\Gamma|}{1-|\Gamma|} \quad (2)$$

In addition, the relation between the voltage reflection coefficient and the impedance can be expressed as follows:

$$\Gamma = \frac{V_0^-}{V_0^+} = \frac{Z_L - Z_0}{Z_L + Z_0} \quad (3)$$

where $V_0^+$ incident voltage, $V_0^-$ is reflected voltage, $Z_0$ is characteristic impedance of the transmission line (i.e. impedance of external connector 102 shown in FIG. 4A and an external connector 506 shown in FIG. 5A), and $Z_L$, is load impedance (i.e. impedance of signal connector 104 shown in FIG. 4A and electronic component 206 shown in FIG. 5A).

Thus, as the voltage reflection coefficient $\Gamma$ changes due to discontinuity of the return path or impedance variation, reference voltage level variations may occur. For example, in FIGS. 4A and 4B, the maximum and minimum voltage amplitudes at the boss A are 10 volts and 3 volts, respectively. The maximum and minimum voltage amplitudes at the boss B are 9 volts and 2 volts, respectively. From equation (2), it can be appreciated that the SWR values are 3.33 and 4.5, respectively. The difference of reference voltage level produces a higher standing wave ratio value, which results from discontinuity of the return path or impedance variation. In FIGS. 5A and 5B, the maximum and minimum voltage amplitudes at the bonding point A' are 9 volts and 4 volts, respectively. The maximum and minimum voltage amplitudes at the bonding point B' are 8 volts and 3 volts, respectively. From equation (2), it can be appreciated that the SWR values are 2.25 and 2.66, respectively. As a result, the electronic device 20 using the electromagnetic interference suppressing device 204 has more similar reference voltage levels at the bonding points A' and B' due to an ideal return path. Relatively, the SWR value tends to be small, so as to reduce electromagnetic interference.

Please note that the electromagnetic interference suppressing device 204 is an exemplary embodiment of the invention, and those skilled in the art can make alternations and modifications accordingly. For example, any shape of the main body 208 which can transmit signals among the signal guiding units, the grounding units, and the grounding pads is suitable. Furthermore, the exterior of the main body 208 can be formed along the external perimeter of the circuit board 202 or the electronic component 206, but this should not be a limitation of the present invention. Preferably, the signal guiding units 210, 212 can be coupled to the bonding portions 222, 224 with direct touch or soldering processes. The grounding units 214, 216, 218, 220 can also be coupled to the ground pads 226, 228, 230, 232 with direct touch or soldering processes. In addition, the ground pads 226, 228, 230, 232 can be formed on the uppermost layer and the lowermost layer of the circuit board 202. For example, the ground pads 226, 228, 230, 232 can be formed on the uppermost layer and the lowermost layer of the circuit board 202 with the same amounts respectively. Or, the ground pads 226, 228, 230, 232 can be formed on the uppermost layer and the lowermost layer of the circuit board 202 in a symmetrical manner. The ground pads 226, 228, 230, 232 can be formed on the circuit board 202 with a bare copper process. The bonding points A' and B' can be realized by a boss or a through-hole. Moreover, the electromagnetic interference suppressing device 204 further includes a fixing unit for fixing the electromagnetic interference suppressing device 204 onto the circuit board 202 or the electronic component 206. On the other hand, as shown in FIG. 2, the main body 208 is formed along the external perimeter of the electronic component 206, and extends to pins 234 coupled between the circuit board 202 and the electronic component 206, so that the main body 208 can be shielded from the electromagnetic interference radiated from the pins 234.

Figure 6A:
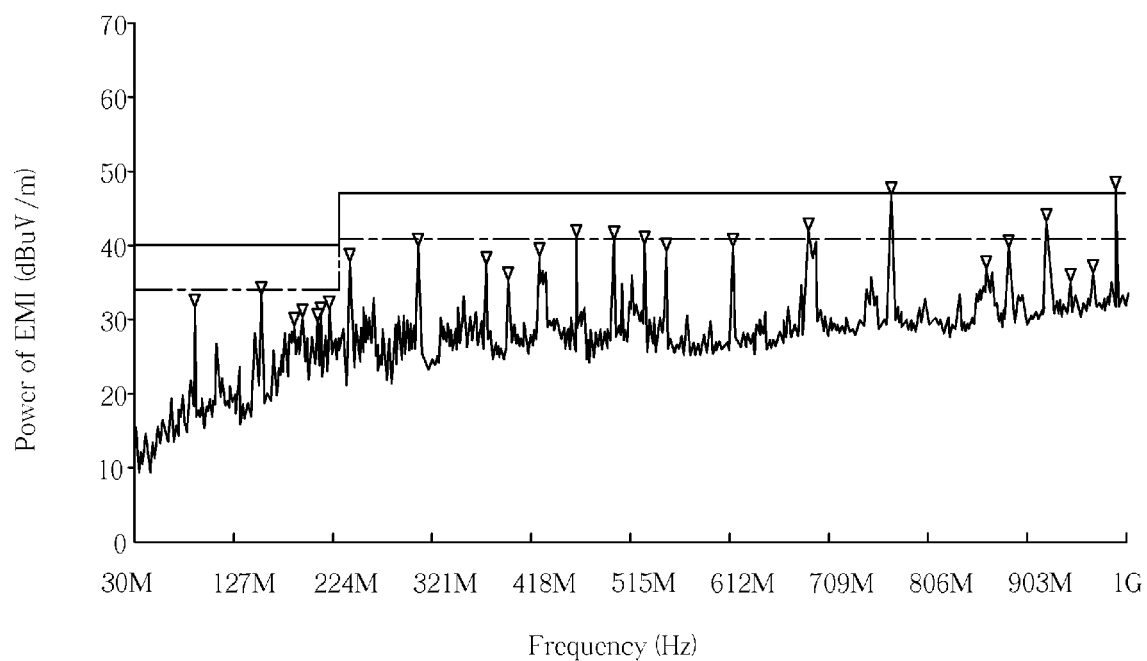
FIG. 6A and FIG. 6B are measurement results of horizontal polarization and vertical polarization of the antenna without using an electromagnetic interference suppressing device, respectively.
Figure 6B:
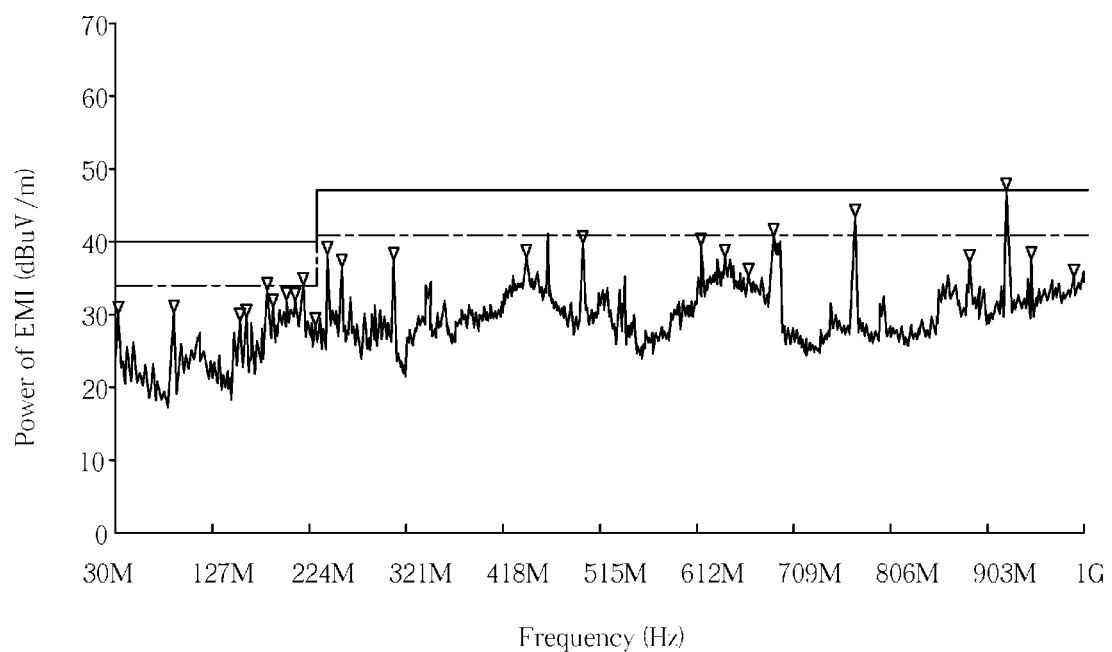
Figure 7A:
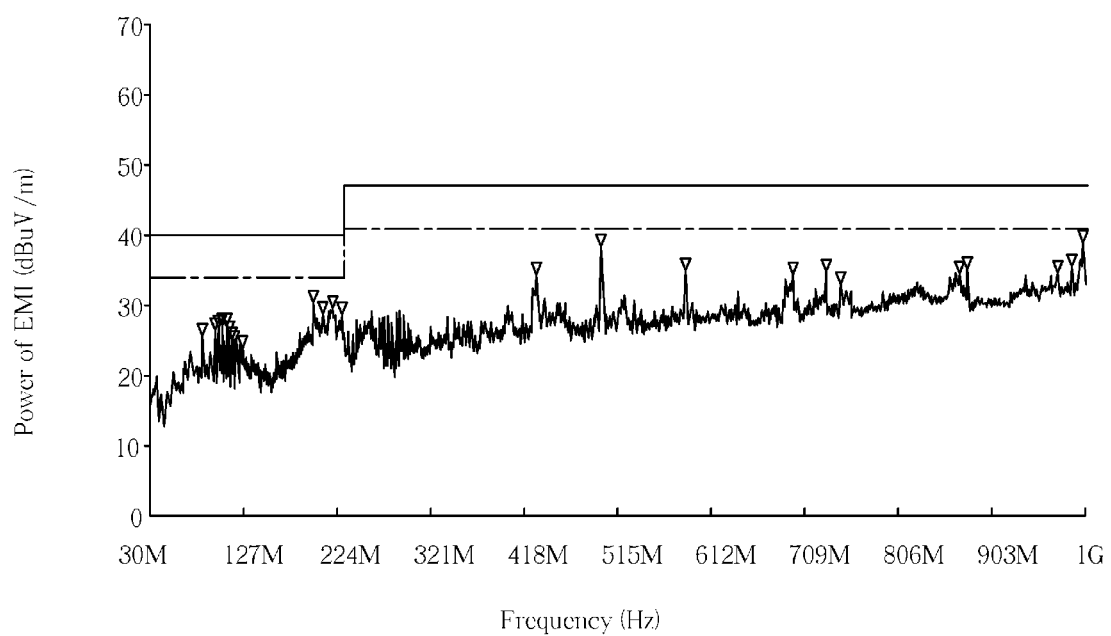
FIG. 7A and FIG. 7B are measurement results of horizontal polarization and vertical polarization of the antenna after using an electromagnetic interference suppressing device according to an embodiment of the invention, respectively.
Figure 7B:
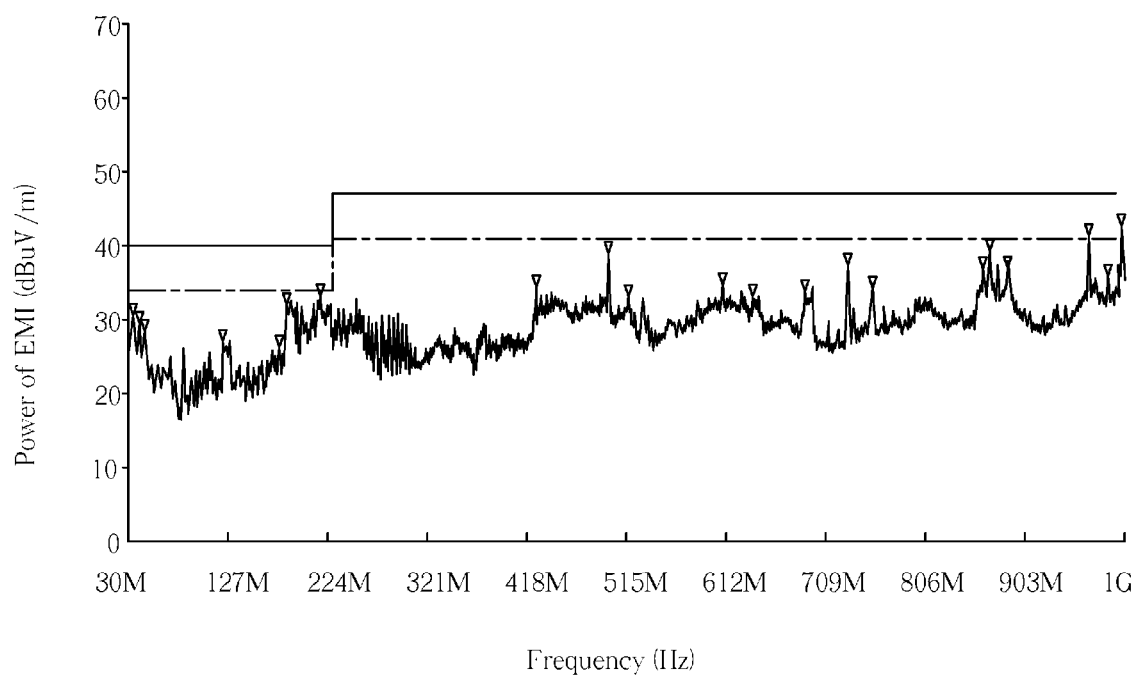

In addition, please refer to FIG. 6A through 7B. FIG. 6A through 7B are measurement results according to an embodiment of the invention. The horizontal axis represents frequency (Hz) and the vertical axis represents power (dBuV/m) of electromagnetic interference. The solid thick line represents a limit line of CISPR22 standard. FIG. 6A and FIG. 6B are measurement results of horizontal polarization and vertical polarization of the antenna without using the electromagnetic interference suppressing device 204 on the electronic component 206 of the circuit board 202. FIG. 7A and FIG. 7B are measurement results of horizontal polarization and vertical polarization of the antenna after using the electromagnetic interference suppressing device 204 on the electronic component 206 of the circuit board 202. In FIG. 6A and FIG. 6B, the measurement results indicate existence of much high energy ground bounce noise. In contrast, the measurement results shown in FIG. 7A and FIG. 7B represent that high energy noise performance can be improved substantially. Obviously, the present invention can provide good suppression of electromagnetic interference and conform to the electromagnetic interference standard of CISPR22 by using the electromagnetic interference suppressing device 204.

In summary, the present invention provides the complete connection among layers of the circuit board to achieve the ideal return path for signal transmission and electromagnetic interference suppression effectively. As a result, the present invention can save circuit board space and manufacturing cost without using the electromagnetic interference shielding material, such as a spring or a gasket. On the other hand, for the manufacturer, the present invention can use single part number arrangement, so as to reduce management cost and probability of errors, and more particularly, the present invention can suppress electromagnetic interference effectively and enhance reliability and stability of the electronic device.

Those skilled in the art will readily observe that numerous modifications and alterations of the device and method may be made while retaining the teachings of the invention.

What is claimed is:

1. An electromagnetic interference suppressing device, comprising:
   a plurality of signal guiding units coupled to a metal housing of an electronic component for receiving a plurality of signals transmitted from the metal housing, wherein the electronic component is installed on a circuit board;
   a plurality of grounding units coupled to a plurality of ground pads of the circuit board for transmitting the plurality of signals to the plurality of ground pads; and
   a main body coupled to the plurality of signal guiding units and the plurality of grounding units for transmitting the plurality of signals between the plurality of signal guiding units and the plurality of grounding units so as to implement a return path;
   wherein power of electromagnetic interference corresponding to the plurality of signals is substantially less than 34 dB-microvolts per meter when frequency bands of the plurality of signals are between 30 megahertz and 224 megahertz and the power of electromagnetic interference corresponding to the plurality of signals is substantially less than 41 dB-microvolts per meter when the frequency bands of the plurality of signals are between 224 megahertz and 1 gigahertz.

2. The electromagnetic interference suppressing device of claim 1, wherein the main body is formed along a perimeter of the circuit board or the electronic component.

3. The electromagnetic interference suppressing device of claim 1, wherein the electronic component is coupled to a grounding layer of the uppermost layer of the circuit board through a plurality of bonding points.

4. The electromagnetic interference suppressing device of claim 1, wherein the plurality of ground pads is formed on the uppermost layer and the lowermost layer of the circuit board.

5. The electromagnetic interference suppressing device of claim 4, wherein the plurality of ground pads are formed with a same amount on the uppermost layer and the lowermost layer of the circuit board respectively.

6. The electromagnetic interference suppressing device of claim 1, wherein the plurality of grounding units is arranged in a symmetrical manner.

7. The electromagnetic interference suppressing device of claim 1, wherein the circuit board is a multi-layer printed circuit board.

8. The electromagnetic interference suppressing device of claim 1, wherein the electronic component is a high-speed signal connector.

9. The electromagnetic interference suppressing device of claim 1, wherein the plurality of signal guiding units, the main body, and the plurality of grounding units are formed as a monolithic structure.

10. The electromagnetic interference suppressing device of claim 1, wherein the plurality of signal guiding units, the main body, and the plurality of grounding units are made of electrically conductive material.

11. The electromagnetic interference suppressing device of claim 1, further comprising a fixing unit for fixing the electromagnetic interference suppressing device onto the circuit board or the electronic component.

12. An electronic device, comprising:
a circuit board for installing an electronic component; and
an electromagnetic interference suppressing device, comprising:
a plurality of signal guiding units coupled to a metal housing of the electronic component for receiving a plurality of signals transmitted from the metal housing;
a plurality of grounding units coupled to a plurality of ground pads of the circuit board for transmitting the plurality of signals to the plurality of ground pads; and
a main body coupled to the plurality of signal guiding units and the plurality of grounding units for transmitting the plurality of signals between the plurality of signal guiding units and the plurality of grounding units so as to implement a return path;
wherein power of electromagnetic interference corresponding to the plurality of signals is substantially less than 34 dB-microvolts per meter when frequency bands of the plurality of signals are between 30 megahertz and 224 megahertz and the power of electromagnetic interference corresponding to the plurality of signals is substantially less than 41 dB-microvolts per meter when the frequency bands of the plurality of signals are between 224 megahertz and 1 gigahertz.

13. The electronic device of claim 12, wherein the circuit board is a multi layer printed circuit board.

14. The electronic device of claim 12, wherein the electronic component is a high-speed signal connector.

15. The electronic device of claim 12, wherein the main body is formed along a perimeter of the circuit board or the electronic component.

16. The electronic device of claim 12, wherein the electronic component is coupled to a grounding layer of the uppermost layer of the circuit board through a plurality of bonding points.

17. The electronic device of claim 12, wherein the plurality of ground pads is formed on the uppermost layer and the lowermost layer of the circuit board.

18. The electronic device of claim 17, wherein the plurality of ground pads are formed with a same amount on the uppermost layer and the lowermost layer of the circuit board respectively.

19. The electronic device of claim 12, wherein the plurality of grounding units is arranged in a symmetrical manner.

20. The electronic device of claim 12, wherein the plurality of signal guiding units, the main body, and the plurality of grounding units are formed as a monolithic structure.

21. The electronic device of claim 12, wherein the plurality of signal guiding units, the main body, and the plurality of grounding units are made of electrically conductive material.

22. The electronic device of claim 12, further comprising a fixing unit for fixing the electromagnetic interference suppressing device onto the circuit board or the electronic component.

* * * * *